United States Patent [19]

Ferry

[11] 4,057,717

[45] Nov. 8, 1977

[54] TRANSFORMER WITH ACTIVE ELEMENTS

[75] Inventor: Michel Ferry, Vallauris, France

[73] Assignee: International Business Machines Corporation, Armonk, N.Y.

[21] Appl. No.: 674,339

[22] Filed: Apr. 7, 1976

[30] Foreign Application Priority Data

May 6, 1975  France ................. 75.15087

[51] Int. Cl.² .................... G06G 7/62; H03H 7/06
[52] U.S. Cl. .................... 364/802; 333/24 R; 364/863
[58] Field of Search ......... 235/184; 333/80 R, 24 R; 250/551-553

[56] References Cited

U.S. PATENT DOCUMENTS

| | | | |
|---|---|---|---|
| 2,923,784 | 2/1960 | Flanagan | 333/24 R |
| 3,109,147 | 10/1963 | Witt | 333/80 R |
| 3,517,342 | 6/1970 | Orchard et al. | 333/80 R |
| 3,573,647 | 4/1971 | Antoniou | 333/80 R |
| 3,713,050 | 1/1973 | Golembeski | 333/80 R |
| 3,824,496 | 7/1974 | Hekimian | 333/80 R |
| 3,936,777 | 2/1976 | Rollett et al. | 333/80 R |
| 3,952,205 | 4/1976 | Tobey, Jr. et al. | 250/552 |

*Primary Examiner*—Felix D. Gruber
*Attorney, Agent, or Firm*—John E. Holl

[57] ABSTRACT

An active transformer is disclosed of the type which includes two primary terminals to which is applied a voltage $v_1$ with a current $i_1$, and two secondary terminals supplying a voltage $v_2$ with a current $i_2$. The transformer is characterized in that it includes a first circuit whose input, connected to the primary terminals, generates an input current of the form $i_1' = jC_1\omega v_1$ and whose output supplies a current of the form $i_2'' = -jN\omega v_1$ to the secondary. The transformer also includes a second circuit whose input, connected to the secondary terminals, generates an input current of the form $i_2' = jC_2\omega v_2$, and whose output supplies a current $i_1'' = -jN\omega v_2$ to the primary. The terms $C_1$, $C_2$ and $N$ are respectively the dual equivalents of the terms $L_1$, $L_2$ and $M$ found in the relations associated with a conventional transformer. The currents flow in such a way that they satisfy the relations $i_1 = i_1' - i_1''$ and $i_2 = i_2' - i_2''$.

7 Claims, 3 Drawing Figures

TRANSFORMER WITH ACTIVE ELEMENTS

FIELD OF THE INVENTION

This invention relates to an electric energy transformer which uses active elements.

BACKGROUND OF THE INVENTION

A conventional transformer comprises inductors consisting of electric wire wound onto a core forming a magnetic circuit. These heavy and bulky elements are particularly troublesome when it is desired to use them in miniaturized electronic circuits. Attempts have therefore been made to replace such elements by electronic circuits capable of performing the same functions. A voltage $v_1$ with a frequency $F = (\omega 2\pi)$ applied to the primary of a transformer generates therein a current $i_1$ which causes a current $i_2$ with a voltage $v_2$ to appear in the secondary. The convention relationships between these currents and voltages are written as:

$$\begin{cases} v_1 = jL_1\omega i_1 + jM\omega i_2 \\ v_2 = jM\omega i_1 + jL_2\omega i_2 \end{cases} \quad (1)$$

where $L_1$, $L_2$ are the values of the primary inductance and of the secondary inductance, respectively, and $M$ is the mutual induction coefficient of the transformer.

Quadrupoles that satisfy expressions (1) and, therefore, provide a transformer function equivalent to that of a transformer have been developed in the past.

However, the prior art circuits are generally costly because they require an excessive number of operational amplifiers.

OBJECTS OF THE INVENTION

Accordingly, the object of the present invention is to provide an active quadrupole capable of performing the functions of a transformer, but requiring a reduced number of operational amplifiers.

SUMMARY OF THE INVENTION

These and other object, features and advantages of the invention are accomplished by the transformer with active elements disclosed herein. An active transformer is disclosed of the type which includes two primary terminals to which is applied a voltage $v_1$ with a current $i_1$, and two secondary terminals supplying a voltage $v_2$ with a current $i_2$. The transformer is characterized in that it includes a first circuit whose input, connected to the primary terminals, generates an input current of the form $i_1' = jC_1\omega v_1$ and whose output supplies a current of the form $i_2'' = -jN\omega v_1$ at the secondary. The transformer also includes a second circuit whose input, connected to the secondary terminals, generates an input current of the form $i_2' = jC_2\omega v_2$, and whose output supplies a current $i_1' = jC_2\omega v_2$, and whose output supplies a current $i_1'' = -jN\omega v_2$ at the primary. The terms $C_1$, $C_2$ and $N$ are respectively the dual equivalents of the terms $L_1$, $L_2$ and $M$ found in the relations associated with the conventional transformer. The currents flow in such a way that they satisfy the relations $i_1 = i_1' - i_1''$ and $i_2 = i_2' - i_2''$.

DESCRIPTION OF THE FIGURES

The foregoing and other objects, features and advantages of the invention will be apparent from the following more particular description of the preferred embodiment of the invention, as illustrated in the accompanying drawings.

DISCUSSION OF THE PREFERRED EMBODIMENT

Figure 1:
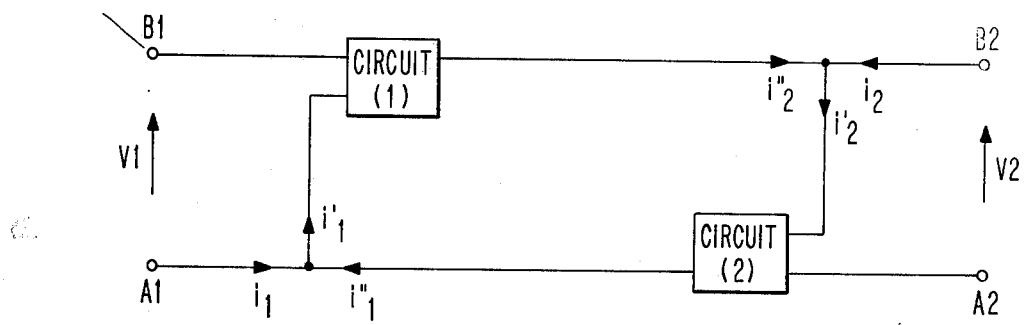
FIG. 1 is a schematic representation of the transformer of the present invention.

The invention is based upon the use of the so-called dual principle which permits converting all current vs. voltage relations into voltage vs. current relations.

If we put $$\begin{cases} v_1' = i_1 r_1 \quad v_2' = i_2 r_2 \\ \text{and} \\ i_1' = \frac{v_1}{r_1} \quad i_2' = \frac{v_2}{r_2} \end{cases} \quad (1)$$

then expressions (1) can be written as $$\begin{cases} i_1' = j\frac{L_1}{r_1^2}\omega v_1' + j\frac{M}{r_1 r_2}\omega v_2' \\ i_2' = j\frac{M}{r_1 r_2}\omega v_1' + j\frac{L_2}{r_2^2}\omega v_2' \end{cases} \quad (2)$$

In accordance with the duality principle, a capacitor is associated with each inductor such that $$C_1 = \frac{L_1}{r_1^2} \text{ and } C_2 = \frac{L_2}{r_2^2}$$

Similarly, term $N = (M/r_1 r_2)$ can be associated with $M$.

Expressions (2) become $$\begin{cases} i_1' = jC_1\omega v_1' + jN\omega v_2' \\ i_2' = jN\omega v_1' + jC_2\omega v_2' \end{cases} \quad (3)$$

If $v_1' = v_1$ and $v_2' = v_2$, then $i_1' = i_1$ and $i_2' = i_2$. Hence:

$$\begin{cases} i_1 = jC_1\omega v_1 + jN\omega v_2 \\ i_2 = jN\omega v_1 + jC_2\omega v_2 \end{cases} \quad (4)$$

A quadrupole which satisfies expressions (4) is schematically illustrated in FIG. 1. A voltage $v_1$ with a current $i_1$ is applied to the input terminals $A_1$, $B_1$. Terminal $B_1$ is connected to one of the inputs of a circuit 1. Terminal $A_1$ is connected both to the second input of circuit 1 and to the output of a circuit 2. The output of circuit 1 is connected to output terminal $B_2$ and to an input terminal of circuit 2 the second input terminal of which is connected to output terminal $A_2$.

If $i_1'$ is the current applied to the input of circuit 1 connected to terminal $A_1$, and if $i_1''$ is the current from circuit 2, then $$i_1 = i_1' - i_1''$$

Similarly, as regards terminal $B_2$, we can write $$i_2 = i_2' - i_2''$$

Figure 2:
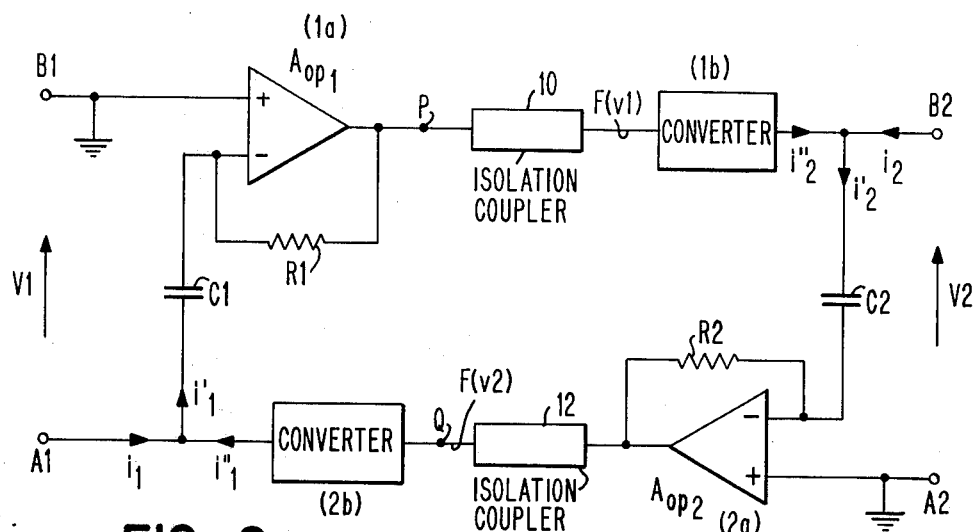
FIG. 2 illustrates an embodiment of the circuits of FIG. 1.

FIG. 2 illustrates an embodiment of the circuits of FIG. 1 when circuits 1 and 2 have been divided into two parts. Considering the reversibility properties of the transformer, identical circuits are used at $1a$, $2a$ and at $1b$, $2b$. Circuit $1a$ includes an operational amplifier Aopl, a capacitor $C_1$ and a resistor $R_1$, and converts voltage $v_1$ to $$f(v_1) = -\frac{R_1}{Z_1} v_1.$$

Since $$Z_1 = \frac{1}{jC_1\omega},$$

$$f(v_1) = -jR_1C_1\omega v_1.$$

The admittance of circuit $1b$ being equal to $(N/C_1R_1)$, the current $$i_2' = -jR_1C_1\omega v_1 \times \frac{N}{C_1R_1} = -jN\omega v_1.$$

Because of the symmetries of the circuits, one may write $$i_1'' = -jN\omega v_2.$$

If it is assumed that operational amplifier Aopl is perfect, its input impedance being infinite, then all of the current $i_1'$ flows through $C_1$ and $R_1$, so that $$i_1' = \frac{v_1}{\frac{(1 + jR_1C_1\omega)}{jC_1\omega}} [1 + jR_1C_1\omega] = jC_1\omega v_1$$

and, similarly, $i_2' = jC_2\omega v_2$.
Thus, one finds again $$\begin{cases} i_1 = jC_1\omega v_1 + jN\omega v_2. \\ i_2 = jN\omega v_1 + jC_2\omega v_2. \end{cases}$$

Figure 3:
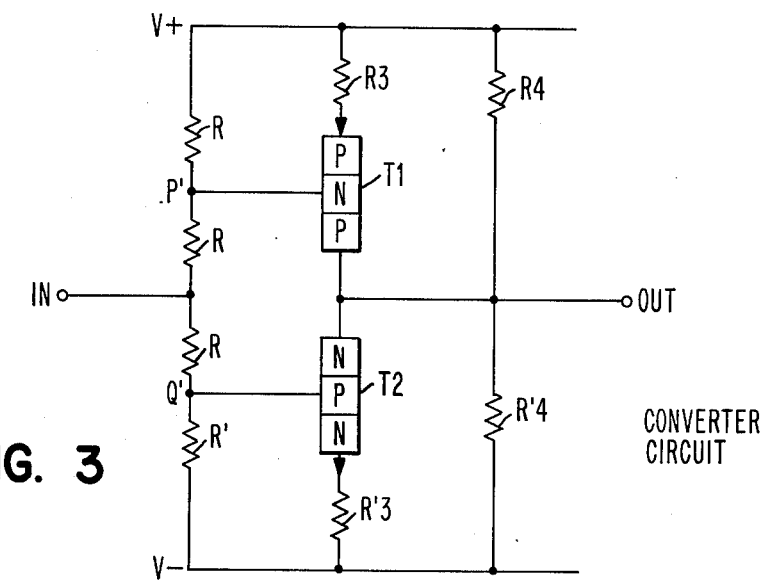
FIG. 3 illustrates an embodiment of circuits 1$b$ and 2$b$ of FIG. 2.

A voltage to current converter capable of generating $i_1'$ and $i_2'$ from voltages $f(v_1)$ and $f(v_2)$ can be implemented in different manners and, in particular, as shown in FIG. 3. The circuit input is at the point labeled IN. The circuit comprises four resistors R connected in series between the V+ and V− poles of a pair of supplies which are symmetric relative to ground. Point P' is connected to the base region of the PNP transistor $T_1$ the emitter region of which is connected to $V^+$ terminal through a resistor $R_3$. The collector region $T_1$ is connected to the collector region of a NPN transistor $T_2$ the base region of which is connected to the point Q' and the emitter region of which is connected to terminal V− through a resistor $R_3'$. The circuit output is obtained at the point common to $T_1$ and $T_2$. This point is also connected to the point common to resistors $R_4$ and $R_4'$ which are connected between V+ and V−. $R_4$ and $R_4'$ are high resistance elements intended to balance the $R_{CE}$ of T and T' so as to maintain the reference level of the OUT terminal to ground. If one selects $$R_3 = R_3' = (R_1/m) \text{ and } R << \beta R_1,$$

where $\beta$ is the gain of transistors $T_1$ and $T_2$, one obtains an output current $$i_2' = \frac{m f(v_1)}{R_1}.$$

In order for the preceding expressions to be verified, one selects $$m = \sqrt{\frac{C_2}{C_1}}.$$

Considering that, usually, $$M = \sqrt{L_1 L_2} \text{, one has } N = \sqrt{C_1 C_2}. \text{ Hence}$$

$$m = \frac{N}{C_1}.$$

Accordingly, we find again $$i_2' = \frac{N}{C_1 R_1} \times f(v_1).$$

A similar circuit makes it possible to obtain $$i_1' = \frac{N}{C_2 R_2} \cdot f(v_2).$$

The circuit is extremely simple and performs the transfer function of a transformer, but provides no galvanic insulation. The latter characteristic can however be provided in the circuit of the present invention, particularly by placing optoelectronic couplers 10 and 12 operating in linear mode at P and Q, respectively.

While the invention has been particularly shown and described with reference to a preferred embodiment thereof, it will be understood by those skilled in the art that various changes in form and detail may be made therein without departing from the spirit and scope of the invention.

What is claimed is:
1. An active transformer of the type which includes two primary terminals to which is applied a voltage $v_1$ with a current $i_1$, and two secondary terminals supplying a voltage $v_2$ with a current $i_2$ when connected to a load circuit, said transformer comprising:
   a first circuit whose input, connected to said primary terminals, generates an input current of the form $i_1' = jC_1\omega v_1$ and whose output supplies a current of the form $i_2'' = -jN\omega v_1$ at said secondary terminals;
   a second circuit whose input, connected to said secondary terminals, generates an input current of the form $i_2' = jC_2\omega v_2$, and whose output supplies a current $i_1'' = -jN\omega v_2$ at said primary terminals;
   the terms $C_1$, $C_2$ and $N$ being respectively the dual equivalents of the terms $L_1$, $L_2$ and $M$ found in relations associated with a conventional transformer, and said currents satisfying the relations $i_1 = i_1' - i_1''$ and $i_2 = i_2' - i_2''$.

2. The active transformer according to claim 1, characterized in that it further includes couplers to provide a galvanic insulation between the primary and the secondary of said transformer.

3. An active transformer of the type which includes two primary terminals to which is applied a voltage $v_1$ with a current $i_1$, and two secondary terminals supplying a voltage $v_2$ with a current $i_2$, when connected to a load current, said transformer comprising:

a first circuit whose input, connected to said primary terminals, generates therein a current $i_1' = jC_1\omega v_1$ and supplies a voltage $f(v_1) = jR_1C_1\omega v_1$;

A second circuit which converts said voltage $f(v_1)$ to a current $i_2'' = -jN\omega v_1$ and which supplies said current $i_2''$ at said secondary terminals of the transformer;

a third circuit whose input, connected to said secondary terminals, generates therein a current $i_2' = jC_2\omega v_2$ and supplies a voltage $f(v_2) = -jR_2C_2\omega v_2$;

a fourth circuit which converts said voltage $f(v_2)$ to a current $i_1'' = -jN\omega v_2$ and which supplies said current $i_1''$ at said primary terminals of the transformer;

the terms $C_1$, $C_2$ and $N$ being respectively the dual equivalents of the terms $L_1$, $L_2$ and $M$ found in relations associated with a conventional transformer, and said currents satisfying the relations $i_1 = i_1' - i_1''$ and $i_2 = i_2' - i_2''$.

4. The active transformer according to claim 3, which further comprises:

optoelectronic couplers connected between said first and second circuits and between said third and fourth circuits, to provide a galvanic insulation between the primary and the secondary terminals of said transformer.

5. The active transformer according to claim 4, wherein said first and fourth circuits include operational amplifiers.

6. The active transformer according to claim 3, wherein said first and fourth circuits include operational amplifiers.

7. The active transformer according to claim 3, wherein said second circuit comprises:

a first, second, third and fourth resistor R connected in series between the V+ and V− poles of a pair of supplies which are symmetric relative to ground;

said first and second resistors connected at a first node, said second and third resistors connected at an input node and said third and fourth resistors connected at a second node;

said first node connected to the base region of a PNP transistor, the emitter region of which is connected to said V+ terminal through a fifth resistor, the collector region of said PNP transistor connected to the collector region of an NPN transistor, the base region of which is connected to said second node and the emitter region of which is connected to said V− terminal through a sixth resistor;

seventh and eighth resistors connected between V+ and V− whose junction connects the collectors of both said transistors to an output node, for providing high resistance elements to balance the $R_{CE}$ of said transistors so as to maintain a reference level of the output node to ground;

whereby an extremely simple circuit performs the transfer function of a transformer.

* * * * *